(12) United States Patent
Wensel et al.

(10) Patent No.: US 6,387,731 B1
(45) Date of Patent: May 14, 2002

(54) METHOD AND APPARATUS FOR REDUCING BGA WARPAGE CAUSED BY ENCAPSULATION

(75) Inventors: Richard Wensel; Scott Gooch, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/334,045

(22) Filed: Jun. 15, 1999

Related U.S. Application Data

(62) Division of application No. 09/251,252, filed on Feb. 16, 1999, now Pat. No. 6,291,899.

(51) Int. Cl.[7] .................. H01L 21/44; H01L 21/48; H01L 21/50; H01L 23/48; H01L 23/52; H01L 29/40
(52) U.S. Cl. .................. 438/121; 438/124; 438/612; 438/613; 257/737
(58) Field of Search .................. 438/108, 612, 438/121, 124; 257/727, 778, 737

(56) References Cited

U.S. PATENT DOCUMENTS

| | | | |
|---|---|---|---|
| 5,477,082 A | 12/1995 | Buckley et al. | |
| 5,708,304 A | * 1/1998 | Tomita | 257/778 |
| 5,834,848 A | 11/1998 | Iwasaki | |
| 5,895,965 A | 4/1999 | Tanaka et al. | |
| 5,900,675 A | 5/1999 | Appelt et al. | |
| 5,926,379 A | 7/1999 | Cadet et al. | |
| 5,990,418 A | 11/1999 | Bivona et al. | |
| 6,020,221 A | * 2/2000 | Lim et al. | 438/125 |
| 6,025,650 A | * 2/2000 | Tsuji | 257/786 |
| 6,078,506 A | 6/2000 | Sugahara | |

OTHER PUBLICATIONS

Graf, Rudolf F., "Modern Dictionary of Electronics," 6th ed. 1997, p. 989.*

* cited by examiner

Primary Examiner—Charles Bowers
Assistant Examiner—Nema Berezny
(74) Attorney, Agent, or Firm—Hugh R. Kress; Winstead Sechrest & Minick, P.C.

(57) ABSTRACT

The present invention provides a ball grid array ("BGA") assembly and process of manufacturing for reducing warpage caused by the encapsulation of the associated semiconductor chip. The assembly and process includes coupling a substrate between a semiconductor chip and a BGA structure; attaching a stabilizing plate to the substrate adjacent the BGA structure; and encapsulating the semiconductor chip.

23 Claims, 4 Drawing Sheets

METHOD AND APPARATUS FOR REDUCING BGA WARPAGE CAUSED BY ENCAPSULATION

This is a divisional of application Ser. No. 09/251,252 filed Feb. 16, 1999 U.S. Pat. No. 6,291,899.

BACKGROUND OF THE INVENTION

1. Field of the Invention

This invention relates in general to a ball grid array ("BGA") assembly, and more particularly to a process and assembly for reducing ball grid array ("BGA") warpage caused by the encapsulation step of an attached semiconductor chip mounted to a substrate.

2. Description of the Related Art

In response to current demands from the electronics industry to produce smaller, faster, and more reliable devices, many semiconductor manufactures have looked at exploiting the advantages of ball grid array ("BGA") technology. There are three major types of BGA assemblies in use today, primarily differentiated by the substrate type: tape ball grid array ("TBGA"), plastic or laminate ball grid array ("PBGA") and ceramic ball grid array ("CBGA"). Each BGA assembly can reduce the required real estate on a card by replacing conventional 304-leaded Quad Flat Packs ("QFP") with a BGA assembly, e.g., 255 I/O CBGA package. Along with the size reduction, the package change allows for an increased connection spacing from 0.020" to 0.050", which is very significant for the surface mount attach process.

FIG. 1 illustrates a cross-sectional view of a conventional BGA assembly 9A before a final encapsulation step. FIGS. 2A and 2B illustrate a top plan view and a cross-sectional view of FIG. 1 after the final encapsulation step. More specifically, these figures show a BGA assembly 9A, 9B manufactured by mounting the semiconductor chip 11 on a desired BGA substrate 15, of a type described above. Once mounted, the contact wires 17 are connected between the chip contact terminals 11A and the substrate contact terminals 15A. Next, an array of solder bumps 19 are attached to the bottom surface of the substrate 15 to establish a connection with the contact wires 17 through the substrate 15.

FIGS. 2A and 2B show the final step for completing BGA assembly 9B. In particular, a protective layer 13, of a material such as an epoxy resin, is deposited to encapsulate the chip 11, the contact wires 17, and a portion of the substrate 15. However, when the encapsulation layer 13 cures, it also shrinks to warp the resultant BGA assembly 9B. This warpage during the encapsulation process is due to the different coefficient of thermal expansion ("CTE") properties between the encapsulating layer 13 and the substrate 15.

If a tested BGA assembly shows signs of warpage, during or after the encapsulation process, it may fail and be scrapped because these types of failures can effect the operation of the resultant assembly. Consequently, process control is the key to high-reliability BGA assemblies.

Currently, the most commonly used process control technique to reduce BGA assembly warpage is encapsulant formulation. However, when an encapsulant formulation technique is used other properties such as processability, reliability, and cost may be sacrificed.

To reduce sacrificing the above properties the manufacturing process for a BGA assembly is evaluated by inspecting the area array connections. The BGA's area array connections are on the bottom side of the package, and thus, visibility to the solder joints is only possible through X-ray. This technique only increases the reliability of the manufacturing process after a problem is found. Therefore, it is imperative that the best process for each particular BGA assembly having an encapsulant formulation be identified and verified prior to any attempt at high-volume manufacturing. In turn, once characterized, these processes must be held constant through the proper selection of equipment and operators to ensure repeatability and high throughput yields. Consequently, the process for manufacturing a BGA assembly having an encapsulation formulation to reduce warpage is not only difficult to effectively and efficiently replicate, but also very costly.

In summary, a warped BGA assembly can be a great reliability concern. If the warpage is reduced then the reliability and processability (i.e., trimming or routing, testing, and board mounting) of a BGA assembly is improved. Currently, conventional process steps for reducing BGA warpage are very costly and complicated. Consequently, it would be advantageous to develop a BGA assembly and process of manufacturing that is not only cost effective, but also reliable, easy to implement, and will ultimately reduce encapsulation warpage.

The present invention is directed to overcoming, or at least reducing the effects of, one or more of the problems set forth above.

SUMMARY OF THE INVENTION

In one aspect of the present invention, a ball grid array ("BGA") assembly provides a substrate coupled between a semiconductor chip and a BGA structure. A stabilizing plate is coupled to the substrate adjacent the BGA structure, and a protective layer is bonded to and over a portion of the substrate adjacent the semiconductor chip.

In another aspect of the instant invention, a method is provided for manufacturing a semiconductor device assembly. The process includes securing a semiconductor chip to a substrate; coupling a BGA structure to the substrate on an opposite surface of the chip; attaching a stabilizing plate to the substrate adjacent the BGA structure; and encapsulating the chip and a portion of the substrate adjacent the chip.

BRIEF DESCRIPTION OF THE DRAWINGS

Other aspects and advantages of the invention will become apparent upon reading the following detailed description and upon reference to the drawings, in which.

Figure 1:
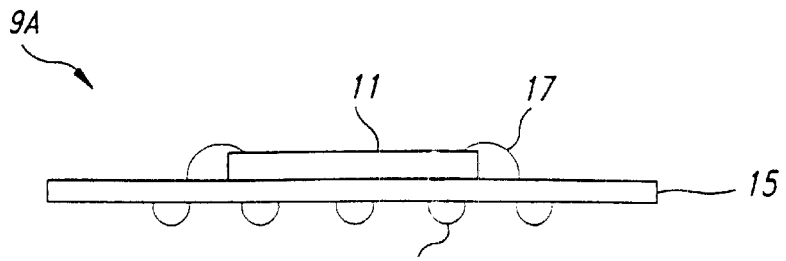
FIG. 1 illustrates a side view of a conventional BGA assembly before the attached semiconductor chip is encapsulated.
Figure 2A:
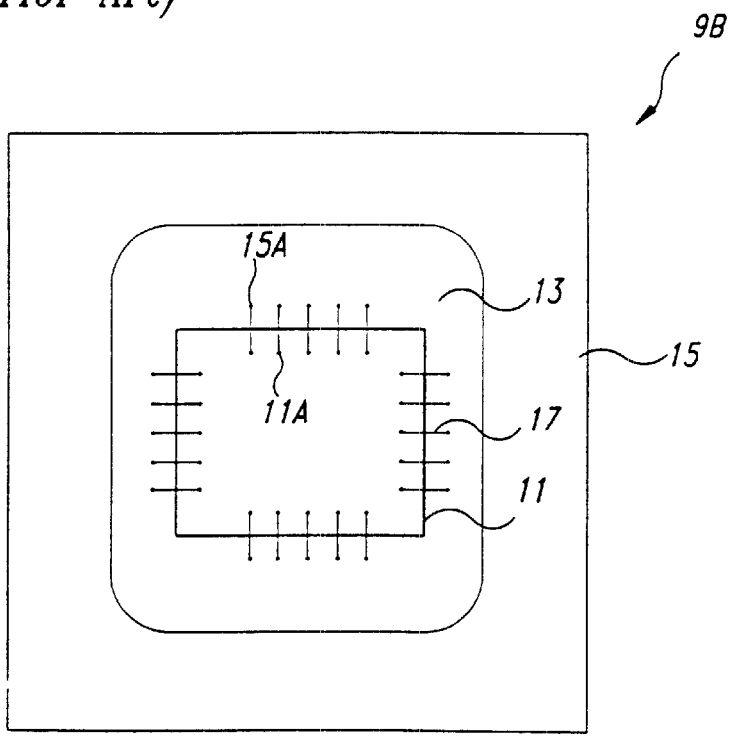
FIG. 2A illustrates top plan view of the conventional BGA assembly of FIG. 1 after the attached semiconductor chip is encapsulated.
Figure 2B:
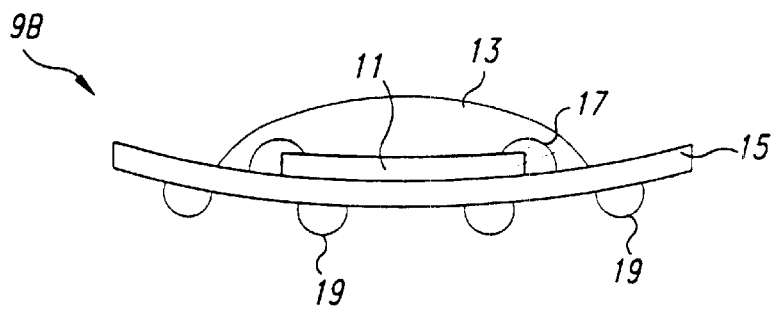
FIG. 2B illustrates a side view of the conventional BGA assembly of FIG. 2A.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

In general, the present invention provides a ball grid array ("BGA") assembly that reduces warpage caused by the encapsulation process step used to protect an associated semiconductor chip. By reducing warpage, the reliability and processability (i.e., trimming, testing, and board mounting) of the resultant BGA assembly is improved. In turn process steps for evaluating problems of a conventional BGA assembly during or after processing can be reduced.

Figure 3A:
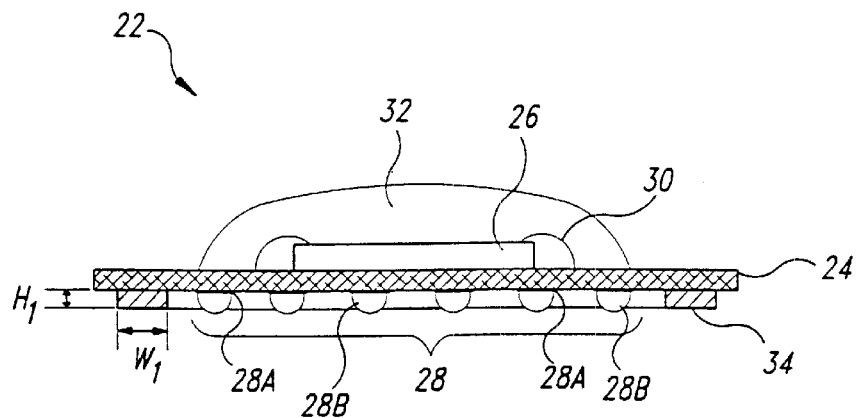
FIG. 3A illustrates a cross-sectional view of a BGA assembly in accordance with one embodiment of the present invention.
Figure 3B:
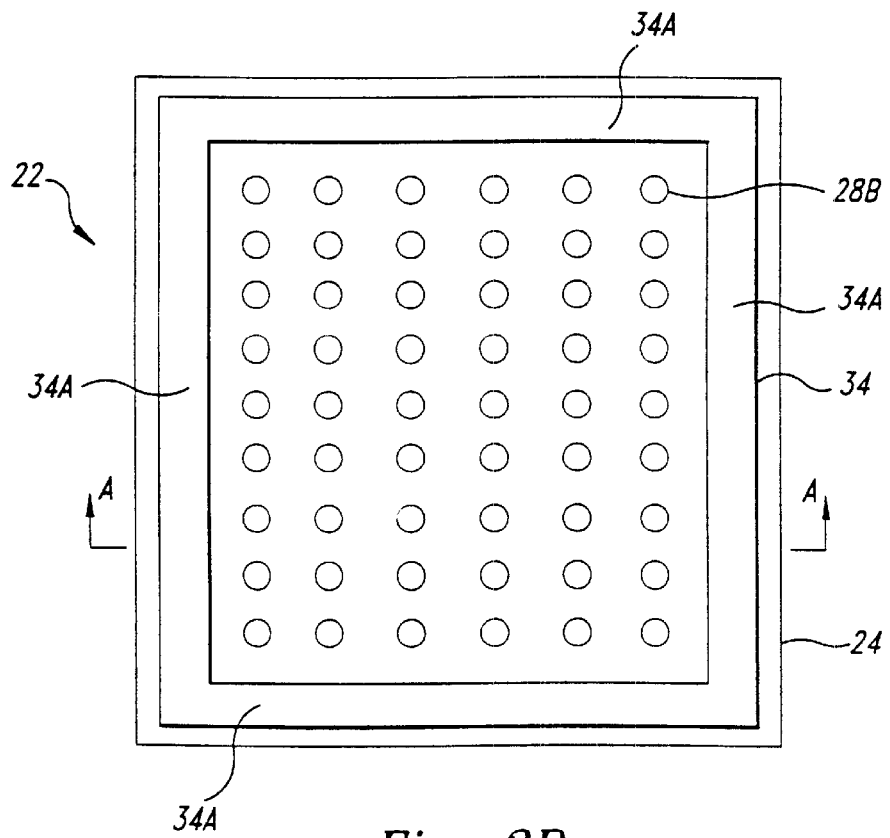
FIG. 3B illustrates a bottom plan view of the BGA assembly of FIG. 3A.

Referring now to the drawings, FIGS. 3A and 3B illustrate a BGA assembly 22 in accordance with one embodiment of the present invention. More specifically, FIG. 3A shows a cross-sectional view of a BGA assembly 22 having a BGA substrate 24 conventionally coupled between a semiconductor chip 26 and a BGA structure 28. The metallic bond wires 30 electrically couple the semiconductor chip 26 to the BGA structure 28 using the substrate 24 and known wire bonding techniques. In the particular embodiment illustrated, the BGA structure 28 provides an array of conductive paste pads 28A coupled between the substrate 24 and the conductive bumps 28B provided by a known method; the metallic bond wires 30 are constructed from a conductive material such as copper, gold, palladium, or aluminum; the conductive bumps and paste pads are constructed from a conductive material such as solder or gold, and the substrate 24 is preferably a BT laminate. However, these aspects are not necessary to the practice of the invention and the invention is not so limited. For example, other tape, plastic (laminate), or ceramic ball grid array substrates such as a FR-4 or a cyanate ester substrate could be used as the BGA substrate 24.

Before the protective layer 32 is applied to encapsulate the semiconductor chip 26, a stabilizing plate 34 is coupled to the bottom surface of the substrate 24. The stabilizing plate 34 provides a greater strength, a greater coefficient of thermal expansion ("CTE"), or both, than does the protective layer 32, the substrate 24, or both. In particular, the strength of the stabilizing plate can be characterized by how rigid the material is relative to the protective layer, substrate or both. Thus, the stabilizing plate 34 is preferably constructed from a rigid material such as copper, aluminum, ceramic, steel or a polymer filled with $SiO_2$ or $Al_2O_3$ or any other material that will change the structural properties of the stabilizing plate. These materials provide a strength and a coefficient of thermal expansion ("CTE") that is greater than the strength and CTE of the protective layer 32 and the substrate 24. This greater strength and/or greater CTE alleviates warpage or bending caused by the curing process of the protective layer 32. The stabilizing plate 34 consequently comprises a first embodiment of a means for stabilizing the BGA structure 22.

The stabilizing plate 34 may be coupled to the substrate 24 in a variety of ways. In one embodiment, the stabilizing plate 34 is coupled to the substrate 24 using an adhesive material such as a lead-on-chip ("LOC") tape, an epoxy, or an adhesive spray. However, if desired, other conventional mechanical or process techniques may be used. For example, in another embodiment, a mechanical securing device such as a clamp, a clip, or a snap may be used to attach the stabilizing plate 34 to the substrate 24. The stabilizing plate 34 might also be plated on or embedded into the substrate 24 using conventional process techniques in other embodiments.

In the particular embodiment illustrated in FIGS. 3A and 3B, the stabilizing plate 34 reinforces the periphery of the BGA structure 22 by surrounding the periphery thereof. To this end, the stabilizing plate includes four arms 34A positioned to surround the periphery of the BGA structure 22 and, consequently, the BGA conductive bumps 28B. This shape strengthens and accommodates any desired BGA structure 28. However, this particular embodiment need not necessarily employ four arms 34A in all its variations, and may employ, e.g., three arms 34A.

The specific dimensions of each arm 34A in the illustrated embodiment provide a height $H_1$ of between about 0.5 to 1.5 mm and a width $W_1$ of between about 1 to 5 mm. It will be appreciated by persons of ordinary skill in the relevant arts that the dimensions of the stabilizing plate 34 may vary depending on the size or amount of the protective layer 32 necessary to cover the semiconductor chip 24. For example, in some embodiments, the height and/or width of the stabilizing plate 34 may vary plus or minus ten percent. In turn, to alleviate problems during final processing steps, e.g., when the resultant BGA assembly 22 is coupled to the desired board (not shown), the height of the conductive bumps 28A will typically be greater than height $H_1$ of the stabilizing plate 34.

Figure 4A:
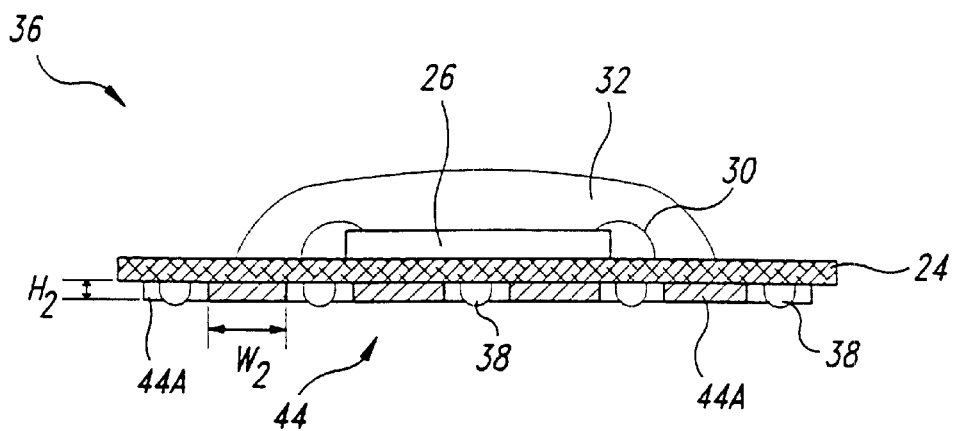
FIG. 4A illustrates a cross-sectional view of a BGA assembly in accordance with another embodiment of the present invention.
Figure 4B:
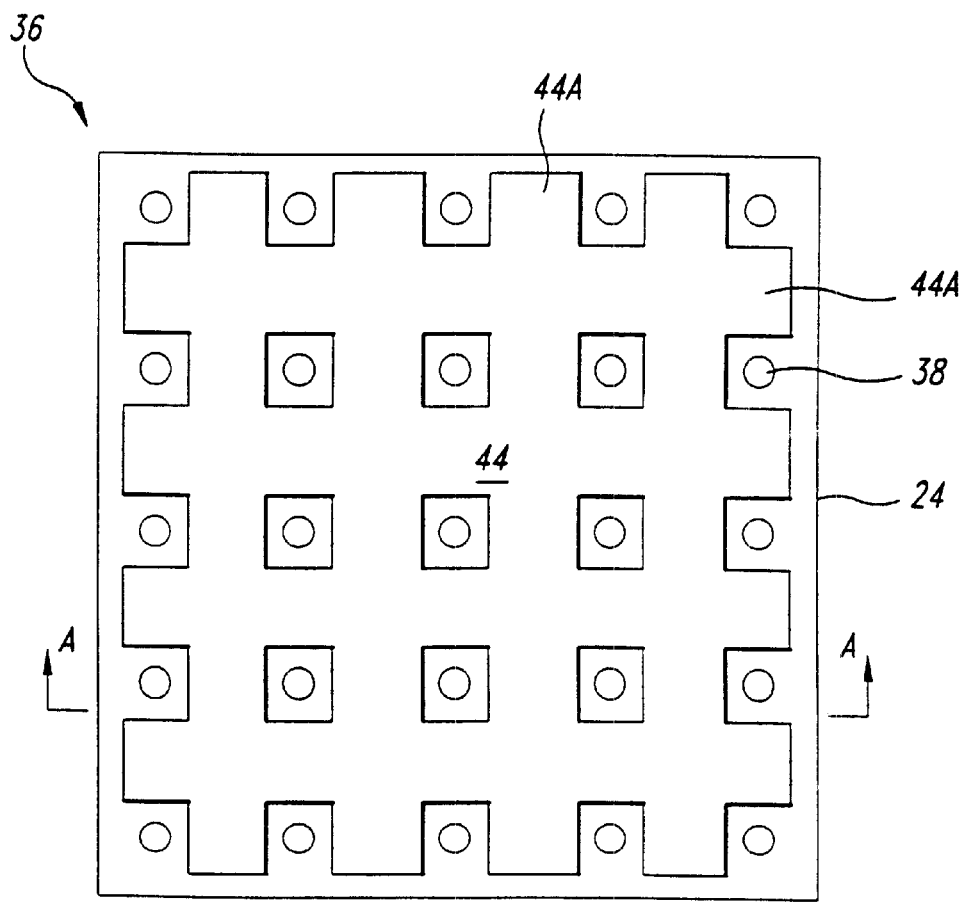
FIG. 4B illustrates a bottom end view of the BGA assembly of FIG. 4A.

Referring now to FIGS. 4A and 4B, a second embodiment constructed in accordance with the present invention is shown. A BGA assembly 36 includes a stabilizing plate 44. In this embodiment, as with the previous embodiment of FIGS. 3A and 3B, a conventional structure is formed that is similar to the BGA assembly 9A of FIG. 1. In particular, the substrate 24 is coupled between the semiconductor chip 26 and an array of conductive bumps 38. However, as illustrated in FIGS. 4A and 4B, the stabilizing plate 44 is manufactured to provide a structure that interlaces between the conductive bumps 38. With this interlacing structure, less material is necessary for each arm 44A to provide the necessary strength for reducing warpage typically caused after the encapsulating layer 32 is applied and shrinks during the curing process. In particular, height $H_2$ will be between about 0.2 and 0.7 mm, and the width $W_2$ will be between about 0.7 and 1.2 mm. However, in some embodiments as described above, the height and/or width of the stabilizing plate 44 may vary plus or minus ten percent. In turn, to alleviate problems during final processing steps. e.g., when the resultant BGA assembly 22 is coupled to the desired board (not shown), the height of the conductive bumps 38 will typically be greater than height $H_1$ of the stabilizing plate 44.

As with the BGA structure 22 of FIGS. 3A and 3B, the stabilizing plate 44 of the BGA assembly 36 provides a strength and CTE that is greater than the strength and CTE of the protective layer 32 and the substrate 24. In turn, as before, the stabilizing plate 44 is preferably made from a material such as copper, aluminum, or a polymer filled with $SiO_2$ or $Al_2O_3$. It will be appreciated by persons of ordinary skill in the relevant arts that height $H_2$ and width $W_2$ of the stabilizing plate 44 may change with respect to the CTE properties of the protective layer 32. Additionally, because the array size of the conductive bumps 38 may vary, so may the number of interlacing arms 44A of the stabilizing plate 44.

Figure 5:
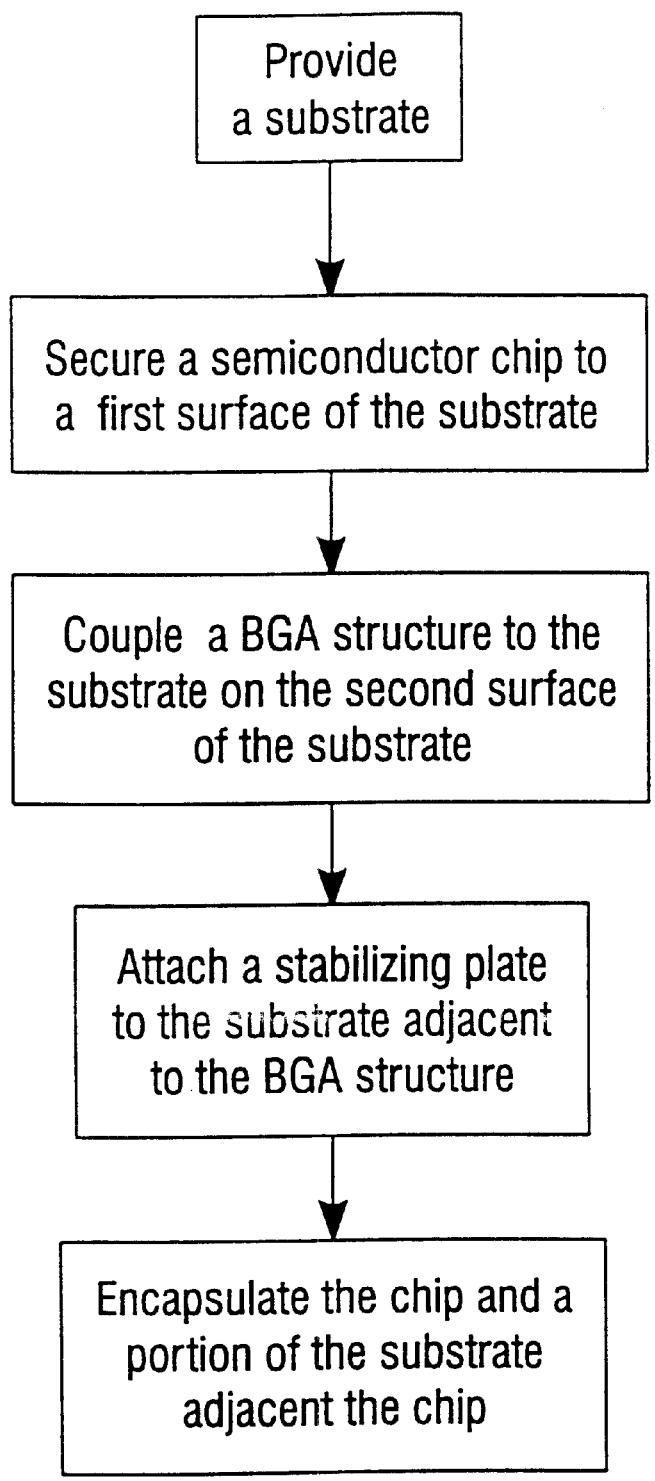
FIG. 5 illustrates one embodiment of a process performed in accordance with the present invention.

Having described the preferred component layouts for the inventive BGA assemblies 22 and 36 of FIGS. 3A, 3B, 4A, and 4B, a description of their process of manufacturing will now follow. The process is generally illustrated in FIG. 5 and begins by providing a substrate. A semiconductor chip is then secured to a first surface of the substrate. The process proceeds by next coupling a BGA structure to the substrate on a surface opposite the first surface. A stabilizing plate is coupled to the substrate adjacent the BGA structure. Finally, the chip and a portion of the substrate adjacent the chip are then encapsulated. Note, however, that the ordering of the process steps, other than providing a substrate and encapsulation, is not material to the practice of the invention. For instance, the stabilizing plate may be coupled to the substrate before the chip is coupled to the substrate.

In one particular embodiment, the method of FIG. 5 is employed to manufacture the embodiment of FIGS. 3A and 3B. For purposes of clarity, the following reference numbers in the below description will be in accordance with the embodiment of FIGS. 3A and 3B. However, this aspect of the invention as illustrated in FIG. 5 is not limited to the embodiment of FIGS. 3A and 3B.

Initially, the desired semiconductor chip 26 is coupled to a BGA substrate 24, such as a BT laminate. Next, an array of solder bumps 28B is deposited onto a complementary array of paste pads 28A, and the metallic bonding wires 30 couple the I/O terminals (not shown) of the semiconductor chip 26 to the solder bumps 28, via some contact terminals (not shown) of the BGA substrate 24.

A conventional BGA assembly, such as the assembly 9A of FIG. 1A, is formed. However, instead of applying the protective layer 32, a pre-manufactured stabilizing plate 34 is attached to the substrate 24. In particular, an LOC tape is used to adhesively couple the stabilizing plate 34 to the substrate 24 using a conventional method. Preferably, the shape of the stabilizing plate 34 is manufactured by a well known process such as selective deposition. however, other conventional methods may be used. For example, the stabilizing plate 34 may be constructed from a stamped plate of aluminum having a width $W_1$ and height $H_1$ of 1 mm.

After the stabilizing plate 34 is secured to the substrate 24, a protective layer 32 made from a material such as epoxy is deposited over the semiconductor chip 26 and allowed to cure. The curing process involves the protective layer 32 shrinking around the semiconductor chip 26 and adjacent the substrate 24 to provide an encapsulating and protective structure. However, because the stabilizing plate 34 is secured to the substrate 24 the resultant BGA assembly 22 experiences little if any warpage after the curing process.

In summary, when a conventional BGA assembly warps during the encapsulation process, or any other manufacturing step, the resultant assembly becomes expendable. Conventional techniques for detecting a warpage problem before, during, or after the manufacturing process for a BGA assembly are expensive and complicated. Therefore the present invention provides a stabilizing plate 34, 44 that can be readily attached to any conventional BGA assembly. Once attached, the stabilizing plate 34 increases the reliability and manufacturability of the resultant BGA assembly 22, 36 by using a rigid inexpensive material that can be shaped into various structures to accommodate any encapsulation. Consequently, the present invention provides a reliable, cost efficient, and effective way to reduce warpage in a BGA assembly after encapsulating an associated semiconductor chip. It will also be appreciated by persons of ordinary skill in the relevant arts that the present inventive assembly is compatible with standard BGA assembly processes.

The particular embodiments disclosed above are illustrative only, as the invention may be modified and practiced in different but equivalent manners apparent to those skilled in the art having the benefit of the teachings herein. For instance, a skilled artisan will appreciate that the stabilizing plates 34 and 44 of the figures do not have to surround and/or interlace between the solder bumps 28 and 38, but rather can be shaped to include any variation in between. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A process of fabricating a semiconductor device assembly, comprising:
   providing a planar substrate including first and second surfaces;
   securing a semiconductor chip to the first surface of the substrate;
   coupling a BGA structure to the substrate on the second surface;
   attaching a stabilizing plate directly to the substrate on the second surface adjacent the BGA structure; and
   encapsulating the chip and a portion of the substrate adjacent the chip with an encapsulant
   wherein said stabilizing plate resists warpage of said substrate during said step of encapsulating.

2. The process of claim 1, wherein coupling the BGA structure includes coupling an array of conductive bumps, and conductive paste pads between the conductive bumps and the substrate.

3. The process of claim 1, wherein providing the substrate includes providing a substrate comprised of a material selected from the group tape, plastic, laminate, and ceramic.

4. The process of claim 3, wherein the substrate is selected from the group including BT laminate, FR-4, and cyanate ester.

5. The process of claim 1, wherein attaching the stabilizing plate comprises attaching a stabilizing plate providing a strength greater than the strength of the encapsulant.

6. The assembly of claim 5, wherein attaching the stabilizing plate comprises attaching a stabilizing plate providing a co-efficient of thermal expansion greater than the co-efficient of thermal expansion of the encapsulant.

7. The process of claim 1, wherein attaching the stabilizing plate comprises attaching a stabilizing plate providing a co-efficient of thermal expansion greater than the co-efficient of thermal expansion of the encapsulant.

8. The process of claim 1, wherein attaching the stabilizing plate includes attaching a stabilizing plate comprised of a material selected from the group including copper, aluminum, ceramic, steel, a polymer filled with $SiO_2$, and a polymer filled with $Al_2O_3$.

9. The process of claim 1, wherein attaching the stabilizing plate includes coupling a stabilizing plate to the substrate by a technique selected from the group comprising clamping, adhering, plating, and embedding.

10. The process of claim 1, wherein attaching the stabilizing plate includes reinforcing the periphery of the BGA structure.

11. The process of claim 1, wherein the BGA structure includes a plurality of solder bumps and attaching the stabilizing plate includes interlacing the stabilizing plate between the BGA solder bumps.

12. The process of claim 1, further including attaching bond wires between the chip and the substrate.

13. A process of fabricating a semiconductor device assembly, comprising:

providing a substantially planar substrate;

attaching a ball grid array ("BGA") structure to a first surface of the substrate;

mounting a semiconductor chip to a second surface of the substrate;

mounting a reinforcing element directly to the periphery of the first surface of the substrate; and applying a protective layer to and over the chip and a portion of the substrate adjacent the chip wherein said reinforcing element resists warpage of said substrate during said step of applying a protective layer to and over the chip.

14. The process of claim 13, wherein attaching the BGA structure includes:

attaching an array of conductive paste pads to the substrate; and coupling a complementary array of conductive bumps to said conductive paste pads.

15. The process of claim 13, wherein providing the substrate includes providing a substrate comprised of a material selected from the group including tape, plastic, laminate, and ceramic.

16. The process of claim 15, wherein the substrate is selected from the group including BT laminate, FR-4, and cyanate ester.

17. The process of claim 13, wherein reinforcing the periphery of the BGA structure comprises coupling to the substrate a rigid plate providing a strength greater than the strength of the substrate.

18. The process of claim 17, wherein reinforcing the periphery of the BGA structure comprises coupling to the substrate a rigid plate having a co-efficient of thermal expansion greater than the co-efficient of thermal expansion of the protective layer.

19. The process of claim 13, wherein reinforcing the periphery of the BGA structure comprises attaching to the substrate a rigid plate having a co-efficient of thermal expansion greater than the co-efficient of thermal expansion of the protective layer.

20. The process of claim 13, wherein reinforcing the periphery of the BGA structure includes coupling to the substrate a rigid plate comprised of a material selected from the group including copper, aluminum, ceramic, steel, a polymer filled with $SiO_2$, and a polymer filled with $Al_2O_3$.

21. The process of claim 13, wherein reinforcing the periphery of the substrate includes coupling a rigid plate to the substrate by a technique selected from the group comprising clamping, adhering, plating, and embedding.

22. The process of claim 13, wherein attaching the BGA structure includes attaching a BGA structure comprising a plurality of solder bumps.

23. The process of claim 22, wherein reinforcing the periphery of the substrate includes interlacing a rigid plate structure between at least some of the BGA solder bumps.

* * * * *